(12) United States Patent
Renato et al.

(10) Patent No.: US 11,329,564 B2
(45) Date of Patent: May 10, 2022

(54) CONTROL SYSTEM FOR A BATTERY SYSTEM

(71) Applicant: Samsung SDI Co., Ltd., Yongin-si (KR)

(72) Inventors: Mandic Renato, Graz (AT); Maximilian Hofer, Hartberg (AT)

(73) Assignee: SAMSUNG SDI CO., LTD., Yongin-si (KR)

( * ) Notice: Subject to any disclaimer, the term of this patent is extended or adjusted under 35 U.S.C. 154(b) by 106 days.

(21) Appl. No.: 16/842,547

(22) Filed: Apr. 7, 2020

(65) Prior Publication Data

US 2020/0395853 A1 Dec. 17, 2020

(30) Foreign Application Priority Data

Jun. 14, 2019 (EP) ..................................... 19180263
Apr. 2, 2020 (KR) ........................ 10-2020-0040458

(51) Int. Cl.
*H02M 3/158* (2006.01)
*G01R 31/40* (2020.01)
(Continued)

(52) U.S. Cl.
CPC ........ *H02M 3/1584* (2013.01); *G01R 31/006* (2013.01); *G01R 31/40* (2013.01);
(Continued)

(58) Field of Classification Search
CPC .. H02M 3/1584; H02M 3/1586; H02M 1/325; G01R 31/40; G01R 31/006; H02J 1/102; H02J 7/0013; Y02T 10/70
See application file for complete search history.

(56) References Cited

U.S. PATENT DOCUMENTS 6,215,290 B1 4/2001 Yang et al.
6,650,556 B2 11/2003 Dinh et al.
(Continued)

FOREIGN PATENT DOCUMENTS

EP 3 300 153 A1 3/2018
EP 2 945 267 B1 5/2018
(Continued)

OTHER PUBLICATIONS

Extended European Search Report issued in EP Application No. 19180263.6 dated Nov. 14, 2019, 12 pages.

*Primary Examiner* — Toan T Vu
(74) *Attorney, Agent, or Firm* — Lewis Roca Rothgerber Christie LLP (57) ABSTRACT

A control system for a battery system is provided. The control system includes: an N-phase DC-DC converter including N single phase DC-DC converters (wherein N is a whole number greater than one); a first microcontroller configured to control a first fraction of the N single phase DC-DC converters; and a second microcontroller configured to control a second fraction of the N single phase DC-DC converters. The first and second microcontrollers are connected to each other via a data line. In a first operation mode, control operations of the first microcontroller and the second microcontroller are synchronized via the data line to commonly control the N single phase DC-DC converters, and in a second operation mode, the first microcontroller and the second microcontroller independently control the first fraction and the second fraction, respectively.

19 Claims, 4 Drawing Sheets

(51) Int. Cl.
*G01R 31/00* (2006.01)
*H02J 1/10* (2006.01)
*H02J 7/00* (2006.01)

(52) U.S. Cl.
CPC ............ *H02J 1/102* (2013.01); *H02J 7/0013* (2013.01); *H02M 3/1586* (2021.05)

(56) References Cited

U.S. PATENT DOCUMENTS

| | | |
|---|---|---|
| 2008/0111517 A1 | 5/2008 | Pfeifer et al. |
| 2008/0129259 A1* | 6/2008 | Endo ................... H02M 3/1584 323/271 |
| 2010/0213897 A1 | 8/2010 | Tse |
| 2014/0002933 A1 | 1/2014 | Gao et al. |
| 2015/0042160 A1* | 2/2015 | Matsuda ................ B60L 58/10 307/10.3 |
| 2018/0123152 A1* | 5/2018 | Matsumoto ....... H01M 8/04649 |
| 2019/0168632 A1* | 6/2019 | Deng ..................... B60L 50/64 |
| 2020/0094758 A1* | 3/2020 | Kawakami .......... H02M 3/1584 |

FOREIGN PATENT DOCUMENTS

| | | |
|---|---|---|
| GB | 2465257 B | 11/2012 |
| WO | WO 2012/122825 A1 | 9/2012 |

* cited by examiner

CONTROL SYSTEM FOR A BATTERY SYSTEM

CROSS-REFERENCE TO RELATED APPLICATION

This application claims priority to and the benefit of European Patent Application No. 19180263.6, filed in the European Patent Office on Jun. 14, 2019, and Korean Patent Application No. 10-2020-0040458, filed in the Korean Intellectual Property Office, on Apr. 2, 2020, the entire contents of which are incorporated herein by reference.

BACKGROUND

1. Field

Aspects of embodiments of the present invention relate to a control system for a battery system and to a battery system including such a control system.

2. Related Art

A rechargeable (or secondary) battery differs from a primary battery in that it is designed to be repeatedly charged and discharged, while the latter is designed to provide an irreversible conversion of chemical to electrical energy. Low-capacity rechargeable batteries are used as power supplies for small electronic devices, such as cellular phones, notebook computers, and camcorders, while high-capacity rechargeable batteries are used as power supplies for hybrid vehicles and the like.

Rechargeable batteries generally include an electrode assembly including a positive electrode, a negative electrode, and a separator interposed between the positive and negative electrodes, a case receiving (or accommodating) the electrode assembly, and an electrode terminal electrically connected to the electrode assembly. An electrolyte solution is injected into the case to enable charging and discharging of the battery (e.g., of the electrode assembly) via an electrochemical reaction between the positive electrode, the negative electrode, and the electrolyte solution. The shape of the case, such as cylindrical or rectangular, may be suitably varied based on the battery's intended purpose.

Rechargeable batteries may be used as (e.g., may be used as a part or component of) a battery module including a plurality of unit battery cells coupled to each other in series and/or in parallel to provide high energy density for, as an example, motor driving of a hybrid vehicle. The battery module may be formed by interconnecting the electrode terminals of the plurality of unit battery cells, the number of unit battery cells and connection arrangement thereof being suitably varied depending on a desired amount of power, to provide a high-power rechargeable battery for, as an example, an electric vehicle. One or more battery modules may be mechanically and electrically integrated, equipped with a thermal management system, and configured to communicate with one or more electrical consumers to form a battery system.

Static control of battery power output and charging may not be sufficient to meet the dynamic power demands of various electrical consumers connected to the battery system. Thus, steady or intermittent exchange of information between the battery system and the controllers of the electrical consumers may be employed. Such information may include the battery system's actual state of charge (SoC), potential electrical performance, charging ability, and internal resistance as well as actual or predicted power demands or surpluses of the consumers.

To monitor, control, and/or set the aforementioned parameters, a battery system usually includes various control units (e.g., controllers), such as a battery management unit (BMU), a battery management system (BMS), and/or a battery system manager (BSM). Each of these control units may be realized (or provided) as an integrated circuit (IC), a microcontroller (μC), an application specific integrated circuit (ASIC), or the like. The control units may be an integral part of the battery system and disposed within a common housing or may be part of a remote control module that communicates with the battery system via a suitable communication bus. In both examples, the control unit communicates with the electrical consumers via a suitable communication bus, such as a CAN or SPI interface.

The electric motor of an electric vehicle may be supplied by a high voltage battery system, such as a 48 V battery system. The high voltage (e.g., 48 V) battery system is connected to a high voltage (e.g., 48 V) board net ("HV board net") that may include electronic control units (ECUs) powered by the high voltage (e.g., 48 V) battery system. The high voltage (e.g., 48 V) battery system is usually charged by an electric generator (e.g., a combined starter-generator). The electric vehicle may further include a low voltage (e.g., 12 V) board net ("LV board net") that may be related to (e.g., that may power) security relevant functions. For example, a power steering system ECU or antiskid (ABS) system may be integrated in (e.g., may be powered by) the low voltage (e.g., 12 V) board net. The low voltage (e.g., 12 V) board net may include a 12 V battery system, such as a lead-acid battery, which may be charged by the starter generator via a DC-DC converter.

Related art electric vehicles usually include a low voltage (e.g., 12 V) battery system, a DC-DC converter, and a high voltage (e.g., 48 V) battery system. As electrical systems become more important for the operation of such vehicles, the availability (e.g., reliability) of the components of the electric system is becoming increasingly important. Thus, even if a failure occurs, such as in the high voltage battery system or the DC-DC converter, a user should be able to operate the vehicle with limited functionality. Further, the security relevant functions, such as those described above, have to meet specific availability standards, such as ASIL B.

Most of the related art systems, considering these and other availability demands of the electric system, primarily focus on the availability of the high voltage battery system. However, the related art systems do not consider the functional safety and availability of the DC-DC converters.

SUMMARY

According to embodiments of the present invention, a control system for a battery system, such as an improved DC-DC converter for a battery system, which contributes to the functional availability of the battery system and satisfies ASIL B requirements, is provided.

An embodiment of the present invention relates to a control system for a battery system, such as a control system for a DC-DC converter for a battery system. The control system, according to an embodiment of the present invention, includes an N-phase DC-DC converter (wherein N is a whole number greater than one) including N single phase DC-DC converters. For example, the N-phase DC-DC converter includes N single phase DC-DC converters that are connected to each other, such that the single phase DC-DC converters may be operated (e.g., operated together) as a multi-phase DC-DC converter. The N single phase DC-DC converters may be arranged (or connected) in parallel between an input node of the N-phase DC-DC converter and an output node of the N-phase DC-DC converter. Further, the N single phase DC-DC converters may be configured to be activated at spaced intervals (e.g., intervals equal to 360°/N) throughout a switching period.

The control system, according to an embodiment of the present invention, further includes a first microcontroller (μC1) that is configured to control a first fraction (e.g., a first group) $N_1$ of the N single phase DC-DC converters. The first microcontroller may be configured to control the duty cycle of each of the $N_1$ single phase DC-DC converters of the first fraction (e.g., may be configured to control the switching elements of each of these converters). The control system further includes a second microcontroller (μC2) that is configured to control a second fraction (e.g., a second group) $N_2$ (e.g., the remaining second fraction or group) of the N single phase DC-DC converters. The first fraction and the second fraction of the single phase DC-DC converters sum up to the total of (e.g., the first and second fractions together include all of) the N single phase DC-DC converters (e.g., $N_1+N_2=N$). The second microcontroller may be configured to control the duty cycle of each of the $N_2$ single phase DC-DC converters of the second fraction (e.g., may be configured to control the switching elements of each of these converters). Each of the first and second microcontrollers is configured as a microcontroller known by those skilled in the art to control N-phase DC-DC converters with the additional functions as described below. Although embodiments of the present invention are described as including two microcontrollers, this is for ease of description, and other embodiments of the control system may include three or more microcontrollers.

The first microcontroller and the second microcontroller are connected to each other via a data line (e.g., they are configured and set up to perform a data communication with each other). For example, the first microcontroller is configured to transmit/receive signals to/from the second microcontroller, and the second microcontroller is configured to transmit/receive signals to/from the first microcontroller. The data line thus enables data communication between the first and second microcontrollers. The data line may be configured for analog or digital data communication.

The control system is configured to operate in at a first operation mode and a second operation mode. In the first operation mode, the control operations of the first and second microcontrollers are synchronized via the data line to allow for common control of the (e.g., of all of the) N single phase DC-DC converters. Hence, in the first operation mode, the N single phase DC-DC converters are operated (e.g., operated together) as an N-phase DC-DC converter, and the first and second microcontrollers are synchronized (e.g., are synchronized between the first and second fractions of the single phase DC-DC converters). Phase synchronization may be carried out by utilizing the data line between the first and second microcontrollers.

In the second operation mode, the first microcontroller autonomously controls the first fraction $N_1$ of single phase DC-DC converters, and the second microcontroller autonomously controls the second fraction $N_2$ of single phase DC-DC converters. For example, in the second operation mode, the first and second microcontrollers control their respective fractions of single phase DC-DC converters individually from each other (e.g., without synchronization). In the second operation mode, the first and second microcontrollers may not have phase synchronization therebetween.

The control system, according to embodiments of the present invention, exhibits improved redundancy, such as by providing the second operation mode. For example, in the first operation mode, the N-phase DC-DC converter is fully functional, i.e., is not in a fault state. In other words, in the first operation mode, the N-phase DC-DC converter operates at full performance (e.g., outputs an output voltage $V_O$ based on an input voltage $V_I$ converted by the common operation of all of the N single phase DC-DC converters with minimal ripple current). Using an N-phase DC-DC converter (e.g., a multi-phase converter) provides improved adaptiveness to the power demands of a connected load, as is known to those skilled in the art, are these aspects and features are achieved in the first operation mode.

However, when a fault occurs in the control system, as described in more detail below, the control system operates in the second operation mode. In the second operation mode, the first and second microcontrollers are not synchronized, and hence, neither are the first and second fractions of single phase DC-DC converters. For example, in the second operation mode, the first fraction of $N_1$ single phase DC-DC converters is operated as a multi-phase DC-DC converter individually of (e.g., separately or independently from) the second fraction of $N_2$ single phase DC-DC converters, which are operated as another (e.g., as a separate or independent) multi-phase DC-DC converter. Therein, each of these individual multi-phase DC-DC converters still converts the input voltage $V_I$ into a respective output voltage $V_{O1}$ or $V_{O2}$, each with reduced ripple current. However, due to the reduced number of operable single phase DC-DC converters, the maximum power output of the fractions $N_1$ and $N_2$ may be reduced.

According to one embodiment, the first fraction includes half of (e.g., $N_1=N/2$) the N single phase DC-DC converters, and the second fraction includes the other half of (e.g., $N_2=N/2$) the single phase DC-DC converters. In this embodiment, when the control system is in the first operation mode, the output voltage $V_O$ of the N-phase DC-DC converter may equal a voltage $V_1$, providing a first power output $P_1$. Then, when the control system is in the second operation mode, the output voltages $V_{O1}$, $V_{O2}$ of the multi-phase DC-DC converters formed by the first and second fractions $N_1$, $N_2$, respectively (e.g., at least the output voltage of the remaining functional fraction $N_1$ or $N_2$) may provide to a second power output of $P_1/2$, respectively.

According to another embodiment, each of the single phase DC-DC converters includes at least two (e.g., a pair) of switches. Each of the single phase DC-DC converters may further include an inductance (e.g., an inductor). Further, a capacitance (e.g., a capacitor) is, in some embodiments, provided either on the level of the individual single phase DC-DC converters and/or on the level of the N-phase DC-DC converter. According to one embodiment, each of the single phase DC-DC converters is configured as a buck converter. Hence, the N-phase DC-DC converter formed by the N single phase DC-DC converters operating collectively (e.g., formed by the $N_1/N_2$-phase DC-DC converter formed by the first and second fraction $N_1/N_2$ of single phase DC-DC converters operating collectively) is configured as a multi-phase buck converter. The at least two switches per single phase DC-DC converter may be transistors, such as MOSFET switches. Further, the single phase DC-DC converters may operate as push-pull converters (e.g., as a half bridge), allowing for up and down conversion of the input voltage.

Multi-phase buck converters, including their setup and operation, are known to those skilled in the art. For example, a detailed description of multi-phase buck converters can be found in Multiphase Buck Design From Start to Finish (Part 1), Application Report from Texas Instruments, SLVA882, published April 2017, the entire content of which is incorporated herein by reference. More information regarding multi-phase buck converters can be found in *Merits of multiphase buck DC-DC converters in small form factor applications*, Texas Instrument (Kae Wong, David Evans), published in 2015, the entire content of which is incorporated herein by reference.

In the first operation mode, in which the N single phase DC-DC converters are operated collectively as an N-phase DC-DC converter, all of the single phase DC-DC converters operate sequentially. In other words, each of the individual DC-DC converters is switched on at an interval $T_i$ (with $T_i=360°/N$) during a switching period of the N-phase DC-DC converter. The individual intervals $T_i$ should not overlap with each other. In the second operation mode, the phases of the $N_1$ single phase converters of the multi-phase converter formed by the first fraction are sequentially operated and/or the phases of the $N_2$ single phase converters of the multi-phase converter formed by the second fraction are sequentially operated. For example, in the second operation mode, only one of the first and second fraction may be active, with the phases of the constituting $N_1/N_2$ single phase DC-DC converters being sequential. In another embodiment, in the first operation mode, the single phase DC-DC converters of the multi-phase DC-DC converter formed by the first fraction are sequentially operated, and the phases of the single phase DC-DC converters of the multi-phase DC-DC converter formed by the second fraction are sequentially operated. In this embodiment, the phases of the first and second fractions may be synchronized. Thus, a higher output voltage $V_O$ is obtained in the first operation mode but with higher ripple current than that of the full N-phase DC-DC converter.

According to another embodiment, the control system is configured to switch from the first operation mode to the second operation mode in response to a fault communication between the first and second microcontrollers. In other words, communication between the first and second microcontrollers may be regularly checked, for example, based on signal timing, check sums, CRC, or the like. As an example, a fault communication may be detected when no signals are received by the first or second microcontroller for more than a reference (e.g., predetermined) time period. Also, communication between the first and second microcontrollers may include a common clock signal and/or the number of functional single phase DC-DC converters in the first or second fraction, respectively. A fault communication may be detected based on communication content, for example, based on an erroneous clock signal or based on a number of non-functioning single phase DC-DC converters in one fraction exceeding a threshold. In some embodiments, each of the first and second microcontrollers performs regular self-control operations and outputs a fault signal when an internal fault state is detected. In this case, a fault communication may be detected by the first or second microcontroller receiving a fault signal from the second or first microcontroller, respectively. Further, the control operation for one or both of the microcontrollers may be performed by another unit, for example, by a system basis chip connected to the microcontroller(s). Also, the first microcontroller may be configured to perform a control operation on the second controller, and/or the second microcontroller may be configured to perform a control operation on the first microcontroller.

According to another embodiment, an output of the first fraction is controlled by a first output switch, and an output of the second fraction is controlled by a second output switch. For example, an output voltage of the $N_1$-phase DC-DC converter is provided to an external node of the control system based on a switching state of the first output switch. Also, an output voltage of the $N_2$-phase DC-DC converter is provided to the external node of the control system based on a switching state of the second output switch. Thus, the output of one of the first and second fractions may be disconnected from a downstream component of the control system, for example, when a fault is detected in that fraction.

The first and second output switches may be controlled by the second and first microcontrollers, respectively. For example, the first microcontroller may be configured to set the conductivity of the second output switch, and the second microcontroller may be configured to set the conductivity of the first output switch. Further, the first microcontroller may be configured to set the second output switch non-conductive in response to receiving a fault signal from the second microcontroller, and/or the second microcontroller may be configured to set the first output switch non-conductive in response to receiving a fault signal from the first microcontroller. Hence, when one of the microcontrollers detects a fault state in the other microcontroller, it can disconnect the DC-DC converters controlled by the faulted microcontroller from downstream loads.

Additionally or alternatively, the control system may be configured to switch from the first operation mode to the second operation mode in response to a fault output of at least one single phase DC-DC converter. For example, the control system may be configured to switch from the first operation mode to the second operation mode in response to a fault output of one of single phase DC-DC converters of the first fraction and the second fraction of DC-DC converters. The output of the DC-DC converters may be compared to a reference voltage, and based on whether or not a difference between the actual output and the threshold voltage exceeds a reference (e.g., predetermined) threshold, a fault state of the respective DC-DC converter(s) is detected (or determined). According to this embodiment, the functionality of the control system is thus not checked (or monitored) on the control level but on the output level and, hence, additional redundancy is provided.

The control system may include one or more shunt resistances (e.g., shunt resistors) configured to detect the output voltage of at least one of the single phase DC-DC converters. For example, the first and/or second microcontrollers may be configured to receive (or read) the detected output voltage(s). In such an embodiment, the first microcontroller is configured to detect (read) the output voltage of at least one of the DC-DC converters of the second fraction, and the second microcontroller is configured to detect (read) the output voltage of at least one of the DC-DC converters of the first fraction. The first and/or second microcontrollers may be further configured to detect a fault state of the second fraction/first fraction based on these readings, respectively. Further, the first and/or second microcontrollers may be configured to set the second output switch/first output switch non-conductive in response to detecting such fault state as described above.

In one embodiment, at least one of the first and second microcontrollers is configured to perform at least one control function with respect to the battery system. The at least one control function may include measurements of cell voltages, cell currents, cell resistances, and/or cell capacities. The control functions may also include active or passive balancing of cell voltages or cell currents of a plurality of battery cells. Accordingly, the control system may be configured to detect a voltage of at least one battery cell and/or may be configured to balance the voltages of a plurality of battery cells. Further, the first and/or second microcontrollers may be configured as one of a battery management system (BMS), battery system manager (BSM), or cell supervision circuit (CSC). However, only one of the first and second microcontrollers may be configured to perform one or more of these control functions to simplify the setup and reduce the component costs for the control system and the battery system.

According to another embodiment, the first microcontroller is connected to the first fraction via a first gate driver stage, and the second microcontroller is connected to the second fraction via a second gate driver stage. For example, each of the microcontrollers is connected to its respective single phase DC-DC converters via its own gate driver stage. But an error (e.g., a fault) may occur at the gate driver stage level. Hence, using only a single gate driver stage for all of (or both of) the microcontrollers could reduce the desired redundancy of DC-DC conversion operations. Therefore, by respectively providing individual gate driver stages for the individual microcontrollers, redundancy is improved. And by detecting a fault state on the control level and/or on the output level of the control system as described above, and because an error of the gate driver stage level may be reliably detected, for example, on the output level, reliability is further improved.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. The electrical connections or interconnections described herein may be realized by wires or conducting elements, for example, on a PCB or another type of circuit carrier. The conducting elements may include metallization, such as surface metallizations and/or pins, and/or may include conductive polymers or ceramics. Further electrical energy might be transmitted via wireless connections, for example, by using electromagnetic radiation and/or light.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media, such as a CD, flash drive, or the like.

Also, a person of skill in the art should recognize that the functionality of various computing devices may be combined or integrated into a single computing device, or the functionality of a particular computing device may be distributed across one or more other computing devices without departing from the scope of the embodiments of the present invention.

Other embodiments of the present invention relate to a battery system for an electric vehicle, such as a high voltage battery system for motor driving of an electric vehicle. The battery system according to embodiments of the present invention may include a battery cell stack configured to provide a first operation voltage to a first output node. The first operation voltage may be a high voltage for, as an example, motor driving of an electric vehicle. The battery system according to embodiments of the present invention further includes the control system according to an embodiment of the present invention as described above. Therein, the first operation voltage provided by the battery cell stack may be provided to the N-phase DC-DC converter as an input voltage. The first operation voltage is provided as an input voltage to the first fraction of DC-DC converters as well as to the second fraction of DC-DC converters. For example, the first operation voltage is provided as an input voltage to each of the N single phase DC-DC converters. An output voltage of the N-phase DC-DC converter may be provided to a second output node. For example, an output voltage of the first fraction of DC-DC converters is provided to the second output node, and an output voltage of the second fraction of DC-DC converters is provided to the second output node. Further, an output voltage of each of the single phase DC-DC converters may be provided to the second output node.

Thus, a voltage is provided to the second output node in a reliable manner. For example, an output voltage is provided to the second output node even if a malfunction occurs in part of (e.g., some of) the N single phase DC-DC converters, thereby providing improved redundancy. Improved redundancy on the control level is provided by the first microcontroller and the second microcontroller communicating with each other via the data line. Further, improved redundancy is provided on level of the single phase DC-DC converters by providing the first fraction $N_1$ of single phase DC-DC converters and the second fraction $N_2$ of single phase DC-DC converters (e.g., by splitting the N single phase DC-DC converters into the first and second fractions).

In an embodiment of the battery system, the first fraction $N_1=N/2$ and the second fraction $N_2=N/2$ (e.g., the first and second fractions each include half the total number N of the single phase DC-DC converters). During the operation of the battery system in the first operation mode, a first power output $P_1$ is applied to the second output node, and during the operation of the battery system in the second operation mode, a second power output $P_2=P_1/2$ is applied to the second output node. The second power output $P_2$ may be half the first power output $P_1$. However, as set forth above and as further described below, other fractions of the single phase DC-DC converters may be provided, and in some embodiments, there may be more than two fractions.

Another embodiment of the battery system further includes a switching unit that is interconnected between the battery cell stack and the first output node as well as the N-phase DC-DC converter. The switching unit may include a first unit switch that is interconnected between the battery cell stack and the first output node, and the first unit switch may set a path between the battery cell stack and the first output node to be either conductive or non-conductive. The switching unit may further include a second unit switch that is interconnected between the battery cell stack and the N-phase DC-DC converter, such as an input node of the N-phase DC-DC converter, and the second unit switch may set a path between the battery cell stack and the N-phase DC-DC converter to be either conductive or non-conductive. The switching unit may further include a third unit switch that is interconnected between the first output node and the N-phase DC-DC converter, such as an input node of the N-phase DC-DC converter, and the third unit switch may set a path between the first output node and N-phase DC-DC converter to be either conductive or non-conductive. The switching unit increases the operative safety of the battery system as it allows for the disconnection of the battery cell stack from any loads connected thereto, either connected via the first output node or the DC-DC converter and the second output node. The switching unit also increases the liberty of the user in using the DC-DC converter as a push pull converter in different ways.

In one embodiment, a starter generator is connected to the first output node, and a low voltage battery is connected to the second output node. In a hybrid vehicle that is operated partially on fossil fuels, the starter generator may be used to charge the battery cell stack. Further, the low voltage battery may be a lead acid battery as is often utilized in vehicles. Hence, there is a direct conductive connection between the battery cell stack and the starter generator, for example, via the first unit switch, and two indirect connections between the battery cell stack and the low voltage battery, for example, via the $N_1$-phase DC-DC converter and the $N_2$-phase DC-DC converter, as well as at least one indirect connection between the starter generator and the low voltage battery via at least one of these aforementioned DC-DC converters. These direct and indirect electric connections allow for different operation modes of the battery system as described below.

By setting the first unit switch non-conductive and the second unit switch conductive, the low voltage battery is charged by the battery cell stack. By setting the first unit switch non-conductive and the third unit switch conductive, the low voltage battery is charged by the starter generator. For example, the low voltage battery system may be powered by the battery cell stack and/or the starter generator via the N-phase DC-DC generator (in a first operation mode) or via one of the first and second fraction of DC-DC converters (in a second operation mode). Powering the low voltage battery system may also include directly powering the low voltage battery system, for example, a low voltage (LV) load, with the low voltage battery operating as a buffer. Further, by setting the first unit switch and the second unit switch non-conductive and the third unit switch conductive, the low voltage battery powers a high voltage load connected to the first output node. For example, a load connected to the high voltage board net may be operated by the low voltage battery for a limited time via the DC-DC converter.

Another embodiment of the present invention relates to a vehicle with a battery system according to an embodiment the present invention as described above, for example, a battery system including a control system according to an embodiment of the present invention as described above. The vehicle further includes a starter generator that is interconnected between the first output node and a ground node of the battery system. The vehicle further includes a high voltage board net interconnected between the first output node and the ground node. At least one high voltage load may be connected to the high voltage board net and may be powered directly by the starter generator or by the battery cell stack. The vehicle further includes a low voltage battery interconnected between the second output node and the ground node of the battery system. At least one low voltage load may be connected to the low voltage board net and may be powered directly by the low voltage battery or via the DC-DC converter(s). For example, the high voltage board net may operate at an operation voltage of about 48 V, and the low voltage board net may operate at an operation voltage of about 12 V.

Further aspects and features of the present invention are described in following description of the drawings.

BRIEF DESCRIPTION OF THE DRAWINGS

Aspects and features of the present invention will become apparent to those of ordinary skill in the art by describing, in detail, exemplary embodiments of the present invention with reference to the attached drawings, in which.

DETAILED DESCRIPTION

Reference will now be made, in detail, to embodiments, examples of which are illustrated in the accompanying drawings. Aspects and features of the exemplary embodiments, and implementation methods thereof, will be described with reference to the accompanying drawings. In the drawings, like reference numerals denote like elements, and redundant descriptions thereof may be omitted. The present invention, however, may be embodied in various different forms and should not be construed as being limited to the embodiments illustrated herein. Rather, these embodiments are provided as examples so that this disclosure will be thorough and complete, and will fully convey the aspects and features of the present invention to those skilled in the art.

Accordingly, processes, elements, and techniques that are not considered necessary for those having ordinary skill in the art to have a complete understanding of the present invention may not be described. In the drawings, the relative sizes of elements, layers, and regions may be exaggerated for clarity.

As used herein, the term "and/or" includes any and all combinations of one or more of the associated listed items. Further, the use of "may" when describing embodiments of the present invention refers to "one or more embodiments of the present invention." In the following description of embodiments of the present invention, the terms of a singular form may include plural forms unless the context clearly indicates otherwise. Expressions, such as "at least one of," when preceding a list of elements, modify the entire list of elements and do not modify the individual elements of the list. It will be further understood that the terms "includes," "including," "comprises," "comprising," and/or "with," when used in this specification, specify the presence of stated features, integers, steps, operations, elements, and/or components but do not preclude the presence or addition of one or more other features, integers, steps, operations, elements, components, and/or groups thereof.

It will be understood that although the terms "first," "second," etc. are used to describe various elements, these elements should not be limited by these terms. These terms are only used to distinguish one element from another element. For example, a first element may be named a second element and, similarly, a second element may be named a first element, without departing from the scope of the present invention.

As used herein, the terms "substantially," "about," and similar terms are used as terms of approximation and not as terms of degree and are intended to account for the inherent deviations in measured or calculated values that would be recognized by those of ordinary skill in the art. Further, if the term "substantially" is used in combination with a feature that could be expressed using a numeric value, the term "substantially" denotes a range of +/−5% of the value centered on the value.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Figure 1:
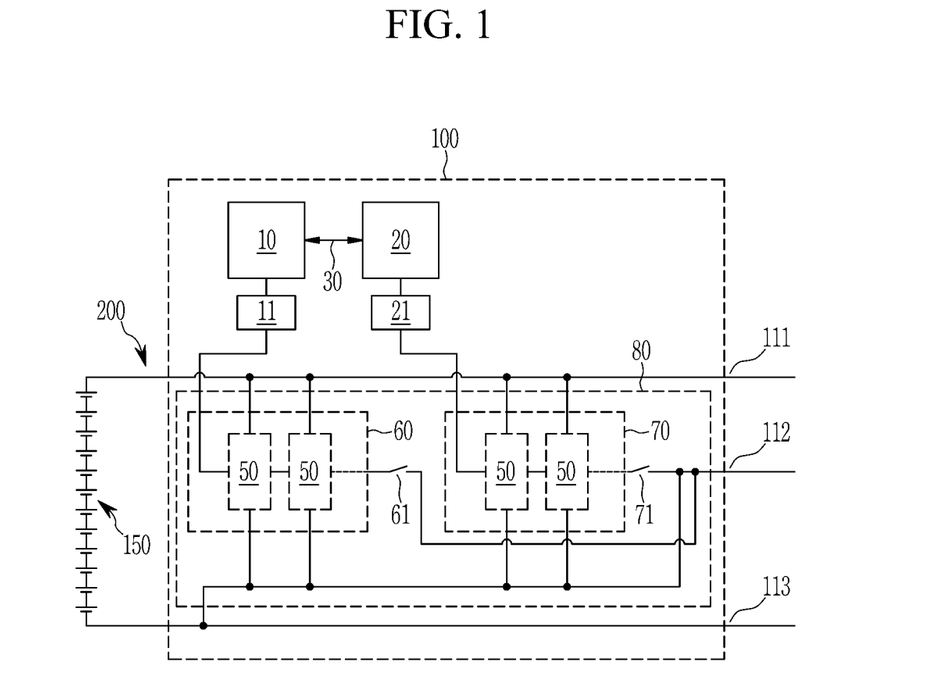
FIG. 1 is a schematic drawing of a battery system with a control system according to a first embodiment.

FIG. 1 is a schematic drawing of a battery system 200, for example, of an electric vehicle, with a control system 100 according to a first embodiment of the present invention. The battery system 200 includes a battery cell stack 150 including a plurality of battery cells interconnected in series and/or in parallel between a first stack node and a second stack node. The first stack node is connected to a first output node 111 of the battery system 200, and the second stack node is connected to a ground node 113 of the battery system 200.

An N-phase DC-DC converter 80 is interconnected between the battery cell stack 150 and the nodes 111, 113 and includes a plurality of (e.g., N, wherein N is a whole number greater than one) single phase DC-DC converters 50. Each of the single phase DC-DC converters 50 has a first input node connected to the first stack node and a second input node connected to the second stack node. Each of the single phase DC-DC converters 50 also has an output node that is connected to a second output node 112 of the battery system 200 via one of a first output switch 61 and a second output switch 71. The N single phase DC-DC converters 50 are divided into a first fraction (e.g., a first group) 60 and a second fraction (e.g., a second group) 70 of single phase DC-DC converters 50. The first fraction $N_1$ 60 of single phase DC-DC converters 50 is connected to the second output node 112 via the first output switch 61, and the second fraction $N_2$ 70 of single phase DC-DC converter 50 is connected to the second output node 112 via the second output switch 71.

The first fraction 60 of single phase DC-DC converters 50 is controlled by a first microcontroller (e.g., µC1) 10 via a first gate driver stage 11. The second fraction 70 of single phase DC-DC converters 50 is controlled by a second microcontroller (e.g., µC2) 20 via a second gate driver stage 21. The first microcontroller 10 and the second microcontroller 20 are connected to each other and in data communication with each other via data line 30. The data line is configured to allow for digital or analog data communication between the first and second microcontrollers.

In a first operation mode of the control system 100, the operative performance of (e.g., the operations of) the first and second microcontrollers 10, 20 are synchronized via the data line 30, and the two microcontrollers 10, 20 function together to commonly control (e.g., to commonly control all of) the N single phase DC-DC converters 50 to form the N-phase DC-DC converter 80. In the first operation mode, an output voltage $V_O$ with minimal ripple current is generated from the input voltage $V_I$ provided by the battery cell stack 150.

In a second operation mode of the control system 100, the first microcontroller 10 and the second microcontroller 20 operate autonomously (e.g., independently or individually from each other) without being synchronized via the data line 30. In the second operation mode, the first microcontroller 10 commonly controls the $N_1$ single phase DC-DC converters 50 of the first fraction 60 to operate as an $N_1$-phase DC-DC converter, and the second microcontroller 20 commonly controls the $N_2$ single phase DC-DC converters 50 of the second fraction 70 to operate as an $N_2$-phase DC-DC converter. The control system 100 may enter the second operation mode in response to (e.g., upon detecting) a fault state of one of the first and second microcontrollers 10, 20, a fault state of one of the first and second gate driver stages 11, 21, or a fault in one of the first and second fractions 60, 70 of the single phase DC-DC converters 50. Thus, in the second operation mode, one of the first and second fractions 60, 70 of DC-DC converters 50 may not operate. Hence, redundancy of DC-DC converter operation is reliably provided in the battery system 200.

Figure 2:
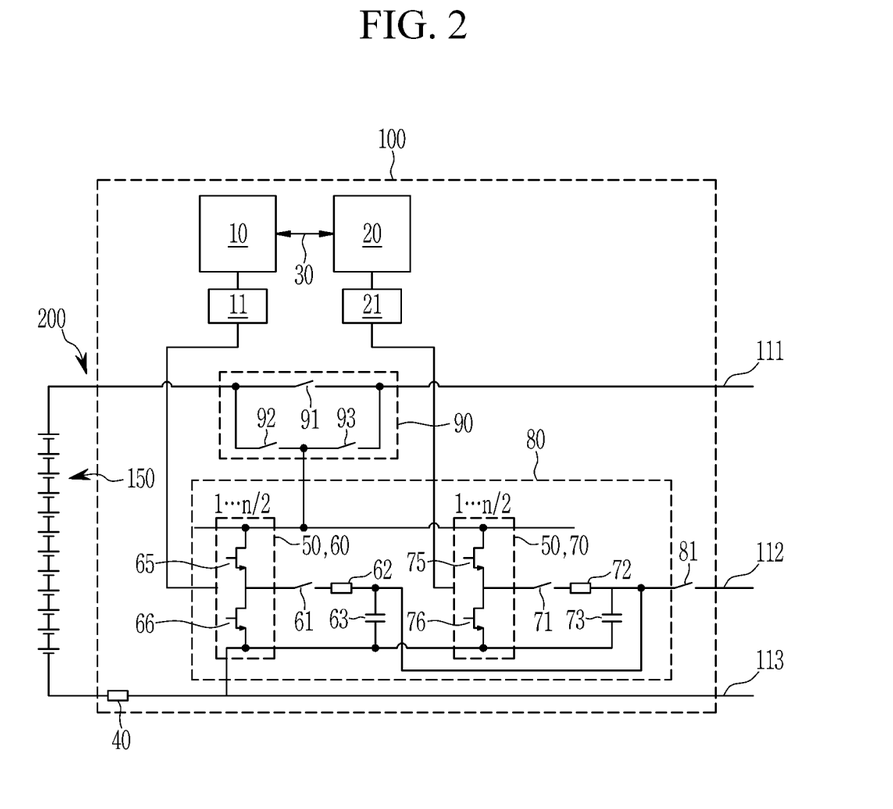
FIG. 2 is a schematic drawing of a battery system with a control system according to a second embodiment.

FIG. 2 is a schematic drawing of a battery system 200 with a control system 100 according to a second embodiment. Insofar the battery system 200 is similar to the battery system 200 shown in FIG. 1, the same elements are denoted by same reference numbers and a repeated description thereof may be omitted.

In the control system 100 shown in FIG. 2, only one single phase DC-DC converter is shown for each of the first fraction 60 and second fraction 70 from among the DC-DC converters for ease of illustration. Each of the single phase DC-DC converters 50 includes a pair of MOSFET switches 65, 66/75, 76 and is thus provided as a push-pull-converter. The first fraction 60 of DC-DC converters 50 is connected to the second output node 112 of the control system 100 via a shared first output switch 61, first output inductance (e.g., a first output inductor) 62, and first output capacitance (e.g., a first output capacitor) 63. The second fraction 70 of DC-DC converters 50 is connected to the second output node 112 via a shared second output switch 71, second output inductance 72, and second output capacitance 73. Hence, each of the first and second fractions 60, 70 of DC-DC converters 50 may be easily disconnected from the second output node 112 by setting the respective output switch 61, 71 non-conductive (e.g., into a non-conductive state). Further, the N-phase DC-DC converter 80 formed by the combination of first and second fractions 60, 70 of DC-DC converters 50 is connected to second output node 112 via a main output switch 81. Hence, the N-phase DC-DC converter 80, as a whole, may be easily disconnected from the second output node 112. The first output switch 61 is controlled by at least the second microcontroller 20, the second output switch 71 is controlled by at least the first microcontroller 10, and the main output switch 81 is controlled by one or both of the microcontrollers 10, 20.

Figure 3:
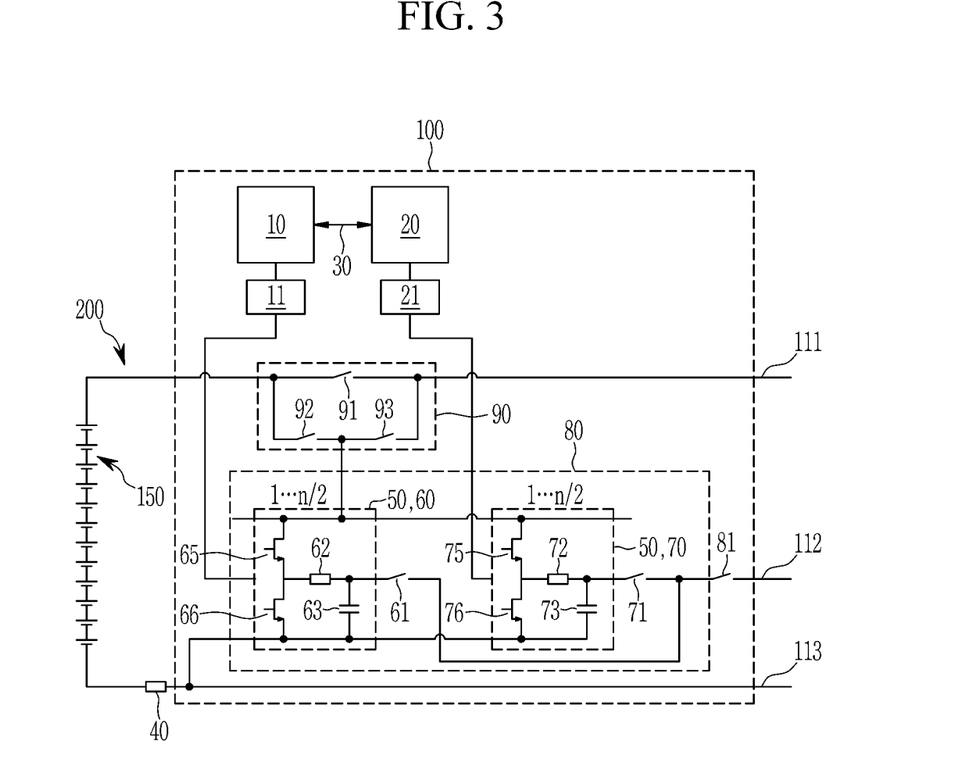
FIG. 3 is a schematic drawing of a battery system with a control system according to a third embodiment.

FIG. 3 is a schematic drawing of a battery system 200 with a control system 100 according to a third embodiment. Insofar as the battery system 200 shown in FIG. 3 is similar to the battery systems 200 shown in FIGS. 1 and 2, the same elements are denoted by same reference numbers and a repeated description thereof may be omitted.

In the control system 100 shown in FIG. 3, each of the single phase DC-DC converters 50 of the first fraction 60 includes an inductance (e.g., an inductor) 62 and a capacitor (e.g., a capacitance) 63, and each of the single phase DC-DC converters 50 of the second fraction 70 includes an inductance 72 and a capacitor 73. Each of these single phase DC-DC converters 50 further includes the pair of MOSFET switches 65, 66/75, 76 and is thus provided as a buck-type push-pull-converter.

Figure 4A:
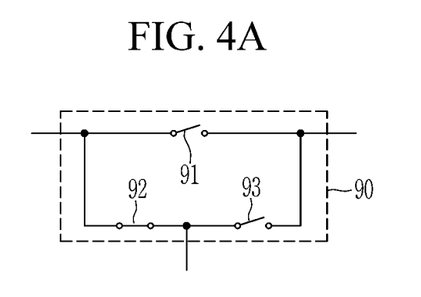
FIGS. 4A-C illustrate the switching unit of a battery system in a first configuration, a second configuration, and a third configuration, respectively.
Figure 4B:
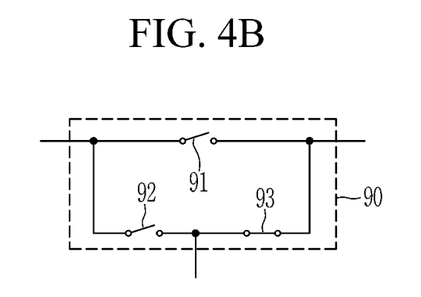
Figure 4C:
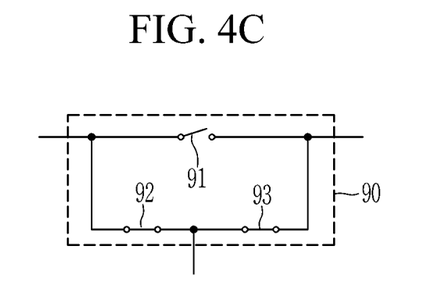

FIGS. 4A-C illustrate a switching unit (e.g., a switch) 90 of the battery system 200 according to the second and/or the third embodiment as illustrated in FIGS. 2 and 3, respectively. The switching unit 90 is illustrated in different configurations in FIGS. 4A-C, each of which can be applied to the battery systems 200 described above.

According to a first configuration of the switching unit 90 as shown in FIG. 4A, the second unit switch 92 is set conductive, while the first unit switch 91 and the third unit switch 93 are set non-conductive. In this configuration, the first output voltage of battery cell stack 150 is provided as an input voltage to each of the N single phase DC-DC converters as shown in FIGS. 2 and 3 (e.g., to the N-phase DC-DC converter 80) or to the first and/or second fraction of DC-DC converters (e.g., to the $N_1$-phase DC-DC converter 60 and/or to the $N_2$-phase DC-DC converter 70). In other words, a first power path is provided from the battery cell stack 150 to the second output node 112 via the right bridge (e.g., the second fraction 70 of DC-DC converters 50) and via a second output switch 71. The second output switch 71 separates (e.g., selectively separates) the right bridge 70 from the left bridge (e.g., the first fraction 60 of DC-DC converters 50).

According to a second configuration of the switching unit 90 as shown in FIG. 4B, the third unit switch 93 is set conductive, while the first unit switch 91 and the second unit switch 92 are set non-conductive. In this configuration, a high voltage load in the high voltage board net that spans between the first output node 111 and the ground node 113 is powered via a low voltage battery that is interconnected between the ground node 113 and the second output node 112. Therein, the low voltage is converted to a high voltage via the N-phase DC-DC converter 80, via the $N_1$-phase DC-DC converter 60, and/or via the $N_2$-phase DC-DC converter 70. In this configuration, ASIL B availability is met on the high voltage (HV) domain additionally or alternatively on the low voltage (LV) domain. Hence, the second configuration may be used when, for example, critical control units for autonomous driving or drive by wire systems, are powered by HV domain.

According to a third configuration of the switching unit 90 shown in FIG. 4C, the first unit switch 91 is set non-conductive, while the second unit switch 92 and the third unit switch 93 are set conductive. In this configuration, the low voltage battery that is interconnected between the second output node 112 and the ground node 113 is charged by the battery cell stack 150 and the HV board net that is interconnected between the first output node 111 and the ground node 113. Hence, in this configuration, redundancy in operating loads connected to the LV board net is provided by utilizing the battery cell stack 150 and the HV board net.

SOME REFERENCE NUMERALS 10 first microcontroller ($\mu C_1$)
11 first gate driver stage
20 second microcontroller ($\mu C_2$)
21 second gate driver stage
30 data line
40 shunt resistor
50 single phase DC-DC converter
60 first fraction of DC-DC converters
61 first output switch
62 first output inductance (e.g., first output inductor)
63 first output capacitance (e.g., first output capacitor)
65 first MOSFET switch
66 second MOSFET switch
70 second fraction of DC-DC converters
71 second output switch
72 second output inductance (e.g., second output inductor)
73 second output capacitance (e.g., second output capacitor)
75 first MOSFET switch
76 second MOSFET switch
80 N-phase DC-DC converter
81 main output switch
90 switch unit (e.g., switch)
91 first unit switch
92 second unit switch
93 third unit switch
100 control system
111 first output node
112 second output node
113 ground node
150 battery cell stack
200 battery system

What is claimed is:

1. A control system for a battery system, the control system comprising:
    an N-phase DC-DC converter comprising N single phase DC-DC converters, N being a whole number greater than two;
    a first microcontroller configured to control a first fraction of the N single phase DC-DC converters; and
    a second microcontroller configured to control a second fraction of the N single phase DC-DC converters, the first and second microcontrollers being connected to each other via a data line,
    wherein the first fraction of the N single phase DC-DC converters and the second fraction of the N single phase DC-DC converters are connected to a common input voltage,
    wherein, in a first operation mode, control operations of the first microcontroller and the second microcontroller are synchronized via the data line to commonly control the N single phase DC-DC converters to output a first power output to a second output node, and wherein, in a second operation mode, the first microcontroller and the second microcontroller independently control the first fraction and the second fraction, respectively, and one of the first fraction of the N single phase DC-DC converters and the second fraction of the N single phase DC-DC converters is disconnected from the second output node such that a second power output that is lower than the first power output is output to the second output node.

2. The control system according to claim 1, wherein N is an even number,
wherein the first fraction comprises N/2 single phase DC-DC converters,
wherein the second fraction comprises N/2 single phase DC-DC converters, and
wherein the second power output is half of the first power output.

3. The control system according to claim 1, wherein each of the N single phase DC-DC converters comprises a pair of switches.

4. The control system according to claim 1, wherein, in the first operation mode, all of the N single phase DC-DC converters operate sequentially.

5. The control system according to claim 1, wherein the control system is configured to switch from the first operation mode to the second operation mode in response to a fault communication between the first and second microcontrollers.

6. The control system according to claim 1, wherein the control system is configured to switch from the first operation mode to the second operation mode in response to a fault output of at least one of the N single phase DC-DC converters.

7. The control system according to claim 1, wherein an output of the first fraction is controlled by a first output switch, and
wherein an output of the second fraction is controlled by a second output switch.

8. The control system according to claim 7, wherein the first microcontroller is configured to set the second output switch non-conductive in response to detecting a fault state from the second microcontroller.

9. The control system according to claim 8, wherein the second microcontroller is configured to set the first output switch non-conductive in response to detecting a fault state from the first microcontroller.

10. The control system according to claim 1, wherein one of the first and second microcontrollers is configured to perform at least one control function with respect to the battery system.

11. The control system according to claim 1, wherein the first microcontroller is connected to the first fraction via a first gate driver stage, and
wherein the second microcontroller is connected to the second fraction via a second gate driver stage.

12. A battery system for an electric vehicle, the battery system comprising:
a battery cell stack configured to provide a first operation voltage to a first output node; and
a control system comprising:
an N-phase DC-DC converter comprising N single phase DC-DC converters, N being a whole number greater than two;
a first microcontroller configured to control a first fraction of the N single phase DC-DC converters; and
a second microcontroller configured to control a second fraction of the N single phase DC-DC converters, the first and second microcontrollers being connected to each other via a data line,
wherein, in a first operation mode, control operations of the first microcontroller and the second microcontroller are synchronized via the data line to commonly control the N single phase DC-DC converters and a first power output is applied to a second output node,
wherein, in a second operation mode, the first microcontroller and the second microcontroller independently control the first fraction and the second fraction, respectively, and a second power output is applied to the second output node, the second power output being less than the first power output,
wherein the first operation voltage is provided as an input voltage to the first fraction of the N single phase DC-DC converters and to the second fraction of the N single phase DC-DC converters, and
wherein an output voltage of the N-phase DC-DC converter is provided to a second output node.

13. The battery system according to claim 12, further comprising a switching unit comprising:
a first unit switch interconnected between the battery cell stack and the first output node;
a second unit switch interconnected between the battery cell stack and the N-phase DC-DC converter; and
a third unit switch interconnected between the first output node and the N-phase DC-DC converter.

14. The battery system according to claim 13, wherein a high voltage board net is connected to the first output node, and a low voltage board net is connected to the second output node,
wherein, when the first unit switch is set non-conductive and the second unit switch and/or the third unit switch is set conductive, the low voltage board net is powered by the battery cell stack and/or the high voltage board net, and
wherein, when the first unit switch and the second unit switch are set non-conductive and the third unit switch is set conductive, the high voltage board net is powered by the low voltage board net.

15. A vehicle comprising the battery system according to claim 12.

16. A battery system for an electric vehicle, the battery system comprising:
a battery cell stack configured to provide a first operation voltage to a first output node; and
a control system comprising:
an N-phase DC-DC converter comprising N single phase DC-DC converters, N being a whole number greater than two;
a first microcontroller configured to control a first fraction of the N single phase DC-DC converters; and
a second microcontroller configured to control a second fraction of the N single phase DC-DC converters, the first and second microcontrollers being connected to each other via a data line,
wherein the first operation voltage is provided as an input voltage to the first fraction of the N single phase DC-DC converters and to the second fraction of the N single phase DC-DC converters, wherein, in a first operation mode, control operations of the first microcontroller and the second microcontroller are synchronized via the data line to commonly control the N single phase DC-DC converters and a first power output is applied to a second output node, and wherein, in a second operation mode, the first microcontroller and the second microcontroller independently control the first fraction and the second fraction, respectively, and a second power output is applied to the second output node, the second power output being half the first power output.

17. The battery system according to claim 16, further comprising a switching unit comprising:
a first unit switch interconnected between the battery cell stack and the first output node;
a second unit switch interconnected between the battery cell stack and the N-phase DC-DC converter; and
a third unit switch interconnected between the first output node and the N-phase DC-DC converter.

18. The battery system according to claim 17,
wherein a high voltage board net is connected to the first output node, and a low voltage board net is connected to the second output node,
wherein, when the first unit switch is set non-conductive and the second unit switch and/or the third unit switch is set conductive, the low voltage board net is powered by the battery cell stack and/or the high voltage board net, and
wherein, when the first unit switch and the second unit switch are set non-conductive and the third unit switch is set conductive, the high voltage board net is powered by the low voltage board net.

19. A vehicle comprising the battery system according to claim 16.

* * * * *